United States Patent [19]

Löfdahl

[11] 4,019,135

[45] Apr. 19, 1977

[54] RECORDING DEVICE FOR ENERGY METERS

[75] Inventor: Christer Edvin Löfdahl, Danderyd, Sweden

[73] Assignee: AB Samefa, Stockholm, Sweden

[22] Filed: Dec. 10, 1974

[21] Appl. No.: 531,372

[30] Foreign Application Priority Data

Dec. 11, 1973 Sweden ............................. 7316727
Nov. 29, 1974 Sweden ............................. 7415023

[52] U.S. Cl. ............................ 324/113; 73/194 R; 324/110; 346/14 MR
[51] Int. Cl.² ...................................... G01R 13/04
[58] Field of Search ................. 324/113, 157, 110; 346/14 MR; 73/194 R

[56] References Cited

UNITED STATES PATENTS 3,380,064  4/1968  Norris et al. ................. 346/14 MR
3,471,083  10/1969  Barnes .............................. 324/113

*Primary Examiner*—Palmer C. Demeo
*Assistant Examiner*—Ernest F. Karlsen
*Attorney, Agent, or Firm*—Spencer & Kaye

[57] ABSTRACT

A device for periodic, automatic, readable recording of a meter value from a consumption measuring meter including a casing attachable to an otherwise conventional meter and provided with a slot, a printing unit disposed within the casing and located out of the plane of the slot in order to be tamper-proof, the printing unit being composed of an identification data printer and a consumption value printer and being adapted upon insertion of a record card in the slot of the casing to apply to the record card a visually readable marking of the identification data and meter consumption value, and a push button connected to the printing unit and manually actuable for causing the marking to be applied to the record card by shifting the printing unit towards the record card inserted into the casing through the slot.

9 Claims, 7 Drawing Figures

RECORDING DEVICE FOR ENERGY METERS

This invention refers generally to periodical automatically readable recording of accumulated consumption units, such as the number of kilowatts consumed according to electricity meters, the number of cubic meters of water consumed in the case of water meters etc., and the invention in particular refers to a manipulation-safe and sealable complementary unit comprising a device for automatic recording of the value indicated by the energy meter regarding consumption units on a record card suitable for computer use, said card being sent from the accountant to the consumer who after recording by means of the device according to the invention returns the record card to the accountant for automatic computation in a computer of the consumed amount to be billed.

The system used at present for debiting, for example, electricity consumption involves providing every household with an electricity meter having a counter marking the electric energy consumed by the household, this system being based, on the one hand, on a periodical preliminary charge irrespective of the amount used and, on the other hand, a subsequent periodical reading of the measured value and a final adjustment of the sums paid to the real amounts used according to the read-off value. This system has several drawbacks, for example the lack of agreement in the amounts debited between the preliminary bills and the final bill, the preliminary payments being either too high or, ordinarily, much too low so that an unexpectedly high final bill will come as an unpleasant surprise for the consumer. Another drawback is the personal visit by a controller in every household (or meter room when the consumption meters of the various households are concentrated in a special room). This personal control is necessarily expensive and causes discomfort to the consumer because the controller must be given access to the room where the meter is positioned. In addition to the difficulty of providing access when, for example, none of the family members is at home, the soiling caused by the controller in connection with bad weather is disagreeable from the point of the consumer. These and other drawbacks and difficulties as well as expenses are substantially eliminated by the present invention due to the specific features indicated in the characterizing parts of the attached claims.

In accordance with the present invention no personal visit of a controller is required for reading the individual energy meters because the invention is based on the idea that a record card designed as a post-card is supplied by the accountant and is sent to the consumer who inserts the record card so obtained into a printing recording unit of the energy meter. The printing recording unit which is provided in the otherwise normal energy meter provides on this record card, suitable for use in a computer, a visually and optically readable marking referring, on the one hand, to the identity of the consumer and, on the other hand, to the measured value. Due to the visually readable marking the individual consumer is in a position to observe the applied marking and to compare it with the value for the preceding recording and thus form an idea regarding the number of units used. The card is thereafter returned to the accountant. Due to the fact that the card is ready for use in a computer and the marking applied is optically readable the accountant will be able directly to insert the card into a computer for automatic calculation of the amounts used and, possibly, direct printing of a bill. The treatment of the individual record cards is thus considerably simplified for the accountant due to the fact that no manual calculation or transfer onto a medium suitable for use in a computer is required. Also for the consumer the above described procedure means substantial comfort because the above mentioned inconvenience of a personal reading are avoided and, at the same time the account received exactly comprises the consumed amount.

The problems in connection with the reading of the measured values of the individual energy meters and the work involved in charging the fees due for the number of consumed units are substantially similar for energy meters other than electricity meters, e.g. meters for measuring the number of units used of a flowing medium, for example water, gas and heat taken from a regional water heating system.

Regarding regional heat measuring the following may be said. In regional heat meters either two or three counters may be included, a water meter or other flow meter in the circulation circuit via a contact unit yielding impulses having a frequency proportional to the flow. An electronic clock actuated by the contact unit of the water meter emits exactly equally long measuring pulses to both resistance thermometers that are passed by a pulse current. The temperature difference is indicated as a difference pulse current which in an AD-converter is transformed into a pulse series the frequency of which is proportional to the temperature difference and the length of which is equal to the length of the measuring pulses. This pulse series is supplied to an electronic counter which with a suitable gear ratio steps forward a counter for heat units. Due to the present invention the measured valves can be stamped onto a charge card sent-out from the accountant's department and the device used in this connection is essentially the same as that used in connection with measuring the consumption of electric energy.

Even if the record card may be made up and sent to the consumer in connection with every paying term it will be obvious that the system comprising preliminarily charges and a periodically recurring recording of the real consumption as a basis for a final adjustment bill may also be applied if desired.

Thus, this invention permits periodical, automatically readable recording of accumulated consumption units, such as the number of kilowatts used according to an electricity meter, of cubic meters of water according to a water meter etc. and the invention is based on the concept of a manipulation-safe and sealable unit in energy meters, said unit being adapted to existing meters and thus forming a complement thereto requiring only extremely small modifications, the unit of course also being adapted to newly manufactured energy meters.

The attached drawings illustrate two arrangements according to the invention shown and described as illustrative examples, it being understood that variations and modifications thereof are imaginable an that the examples shown and described only are two out of a great number of possible embodiments.

FIG. 3 shows a possible embodiment of a power supply circuit for the electricity meter in which three-phase current is use for supplying power in such a way that the meter is in operation and shows the current consumption irrespective of whether some of the phases are inoperative.

Figures 3, 4:
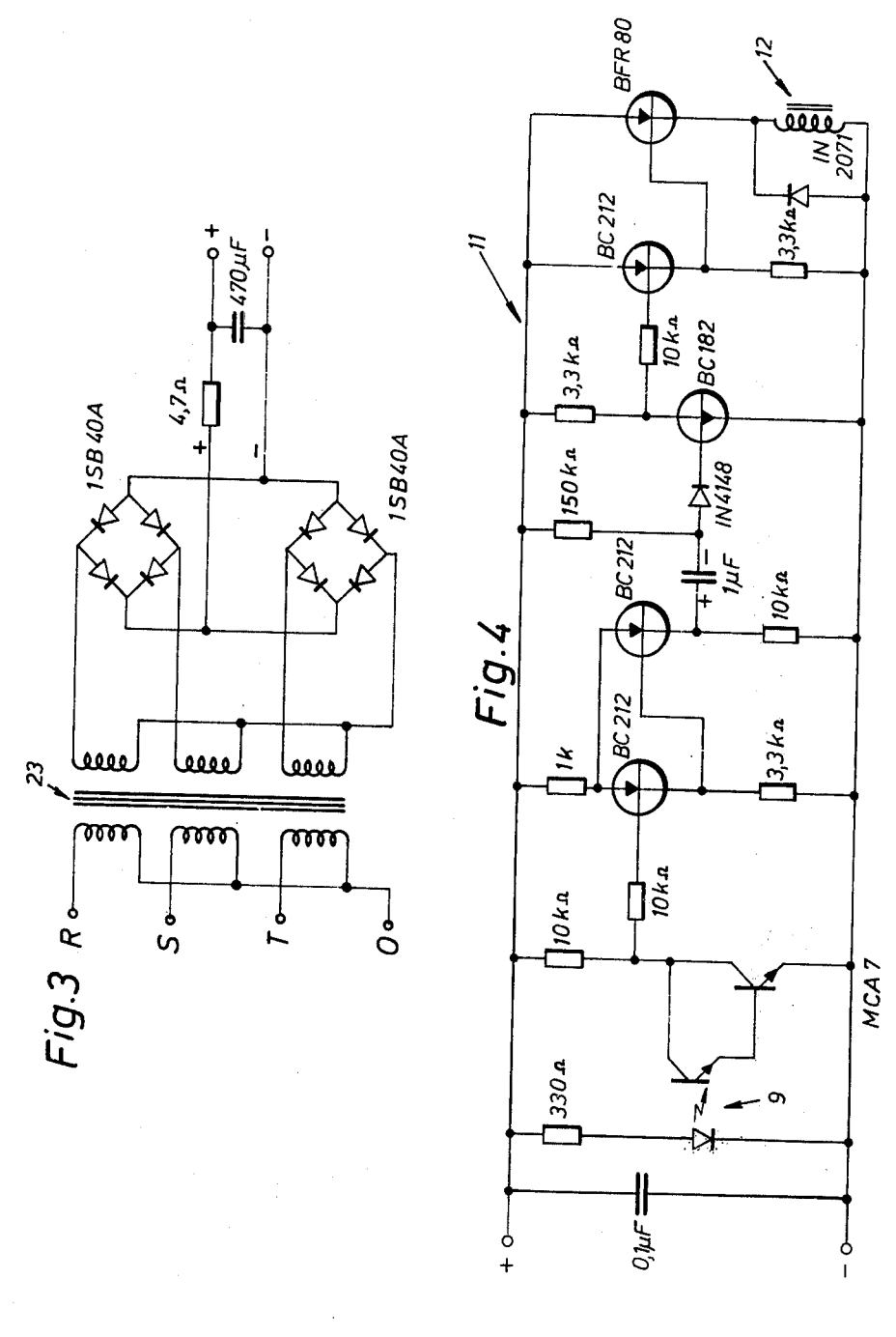

FIG. 4 shows a wiring circuit for the electronic part of the mark printing electricity meter according to the invention in which the left-hand part of the electronic circuit shown and intended to serve as an example of possible circuits indicates the optical reflection sensor according to the invention whereas the right-hand portion of the circuit indicates the pulling magnet which shifts forward the counter one step when the optical reflection sensor has identified a nonreflecting portion on the rotary disc according to the invention.

Figure 5:
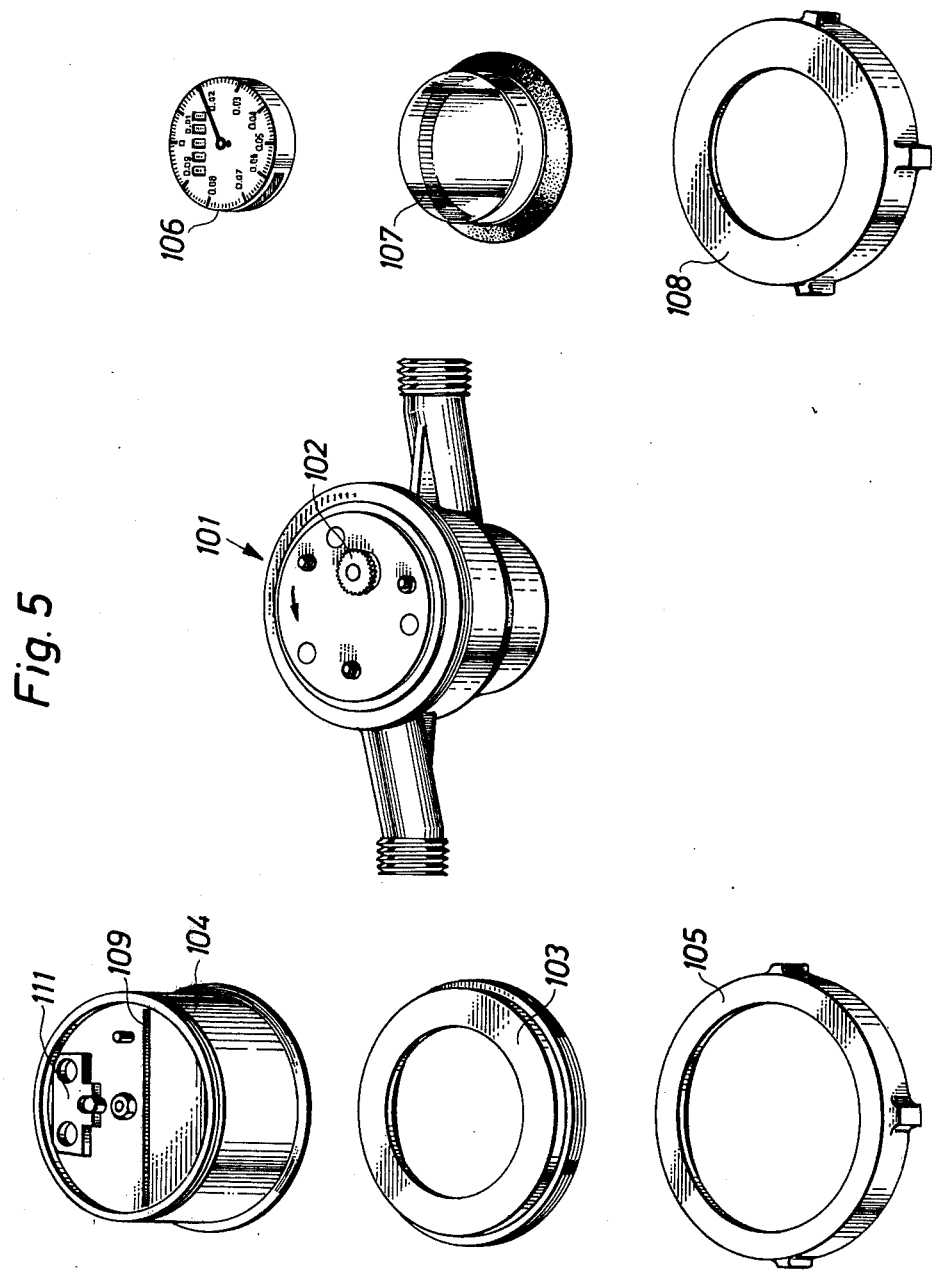

FIG. 5 is a picture showing to the left the units forming part of a device according to the invention for use in a water meter whereas the conventional unit eliminated when the invention is used are shown to the right.

Figure 6:
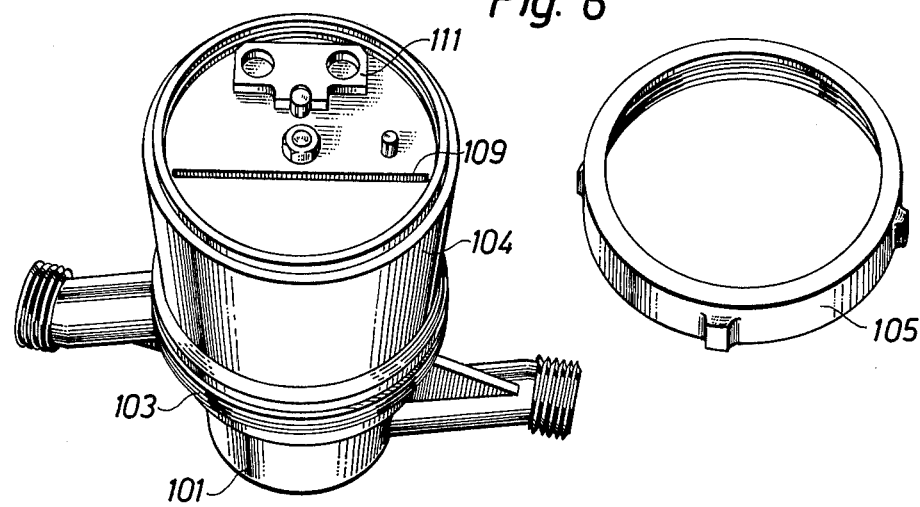

FIG. 6 shows a device according to FIG. 5 in partly assembled condition.

Figure 7:
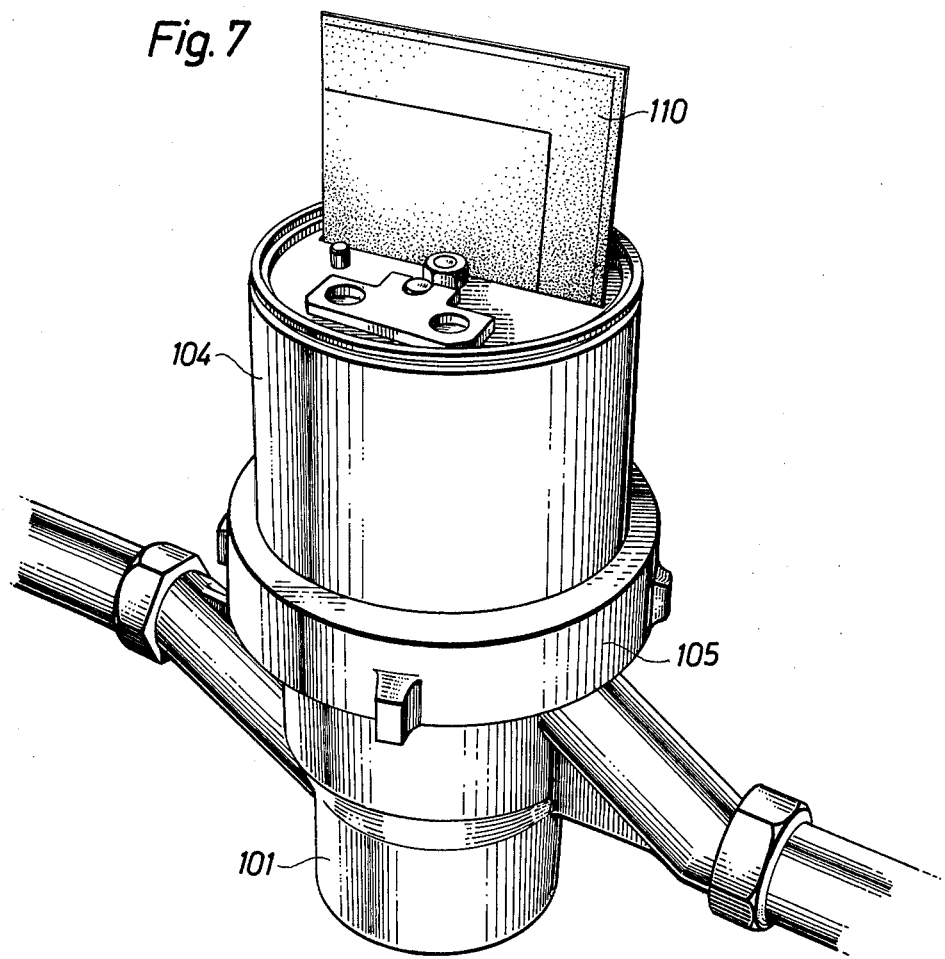

FIG. 7 shows a device according to FIGS. 5 and 6 during use.

Figure 1:
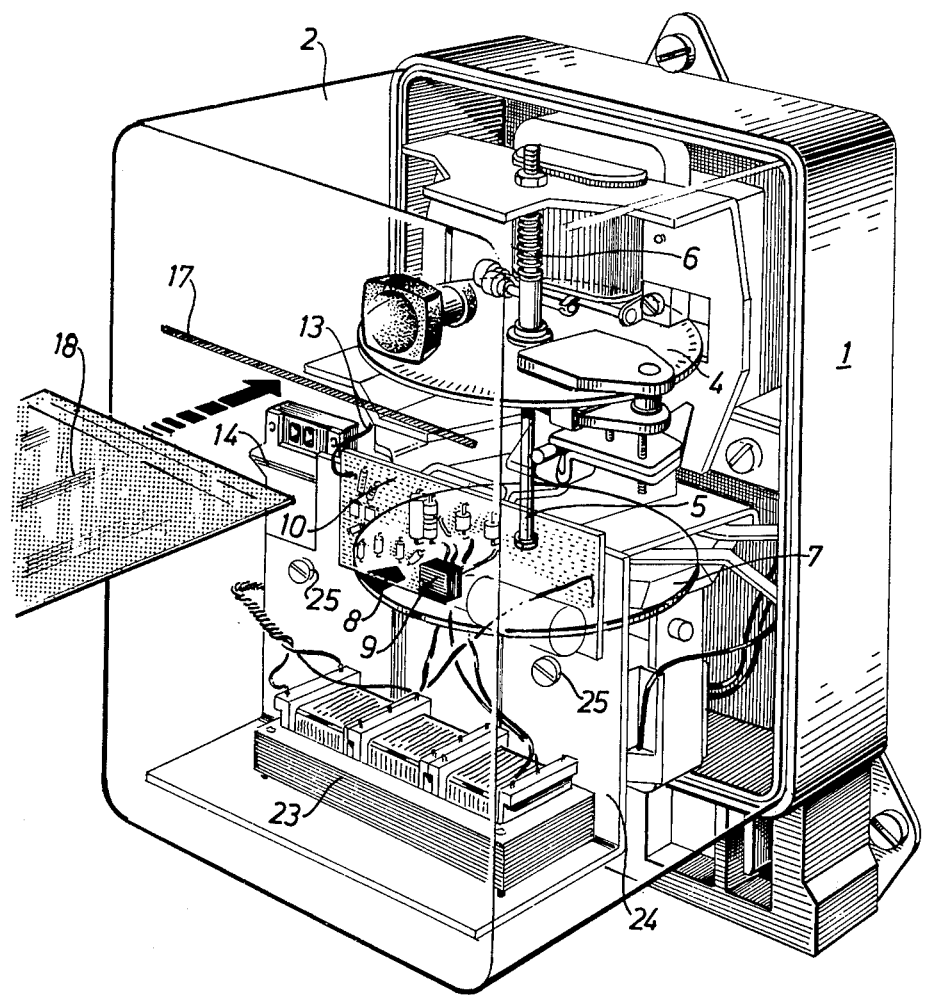
FIG. 1 is a perspective view of an electricity meter in accordance with the invention in which a record card is shown being introduced through an inserting slot in the transparently drawn, sealable casing containing the recording unit according to the invention.
Figure 2:
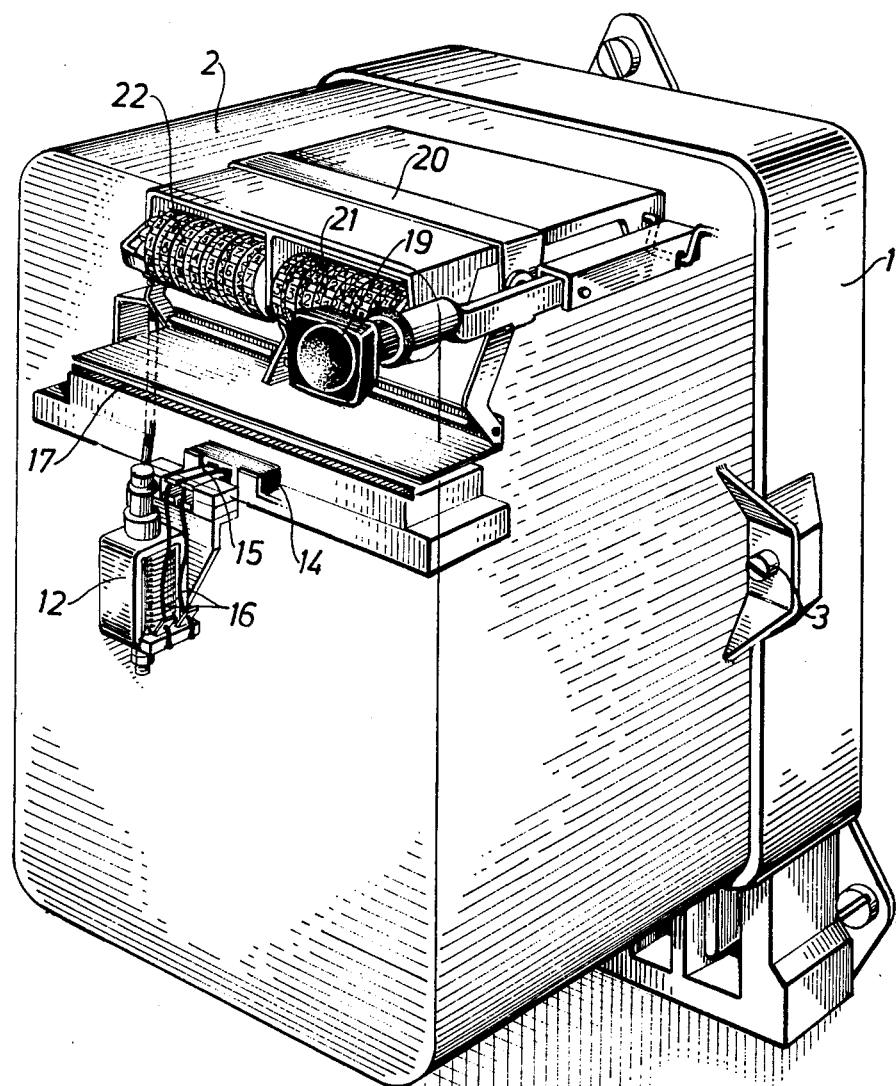
FIG. 2 is a perspective view of the casing of an electricity meter in which the recording unit placed within the casing is visible through the transparently illustrated casing.

As shown in FIG. 1 a conventional electricity meter 1 is provided with an outer casing 2 which as shown in FIG. 2 is attached to the electricity meter 1 by means of a sealable screws 3 or similar sealing means. The electricity meter comprises in a normal way iron cores for rotating rotary aluminum discs 4, 7, said cores having windings for producing magnetic fields the strength of which is dependent on the magnitude of the consumed current. The magnetic flows so produced thereby give rise to induction currents in the aluminum discs 4, 7, the co-operation between these currents and the magnetic fields producing rotary moments acting on the discs as known in the art. The rotary discs 4, 7 are centrally journalled on a rotary shaft 5 which is supported with very low friction in precision bearings. On the upper part of the central shaft 5 threads 6 are conventionally provided for engagement with a cog wheel transmitting the rotation of shaft 5 to a counter for marking the rotation of shaft 5. As shown in FIG. 1 this counter is removed in the preferred embodiment of the invention to avoid the braking force moment previously produced by the counter.

In accordance with the invention, e.g. rotary disc 7 is reflective except on a non-reflective field 8. An optical reflection sensor 9 is adapted to emit a signal towards the disc, which signal normally is reflected back into the reflection sensor; however, when the non-reflective field 8 passes over the reflection sensor the signal will not be reflected back causing the electronic circuit 11 shown as illustrative example in FIG. 4 and identified in FIG. 1 by the circuit card 10 to produce and reinforce an electric signal transmitted to the pulling magnet 12 via conductors 13, coupling means 14, contact means 15 and conductors 16.

The casing 2 is provided with an inserting slot 17 through which a record card 18 of a type suitable for computer treatment may be inserted a distance into casing 2. Within casing 2 a printing device 20 is arranged in a way eliminating risk of manipulation, said printing device being operated by means of a push button 19. The printing device 20 comprises an identifying means 21 for the specific meter and a counter 22 arranged in a conventional way and fed forward by a stepping device by means of the pulling magnet 12. In the example shown the printing device 20 is positioned inaccessible for manipulation due to the fact that it is shifted out of the plane in which the inserting slot 17 is provided. When a recording is to be made on the record card the push button 19 is actuated to move down unit 20 and produce a recording of the metered value on the record card. The marking obtained is visually and optically readable so that the consumer may read the measuring value on the record card, this value also being optically readable in a computer.

In the embodiment shown the printing device 20 and the pulling magnet 12 are attached to the inside of casing 2 whereas the transformer 23 used for transforming the three-phase current to a suitable power supply current as well as the circuit card 10 are mounted on a mounting plate 24 held by attachment screws 25 in the electricity meter. However, it will be understood that both the transformer 23 and the circuit card 10 may be mounted in casing 2 so that the only modification required for the meter itself is the provision of the non-reflective field 8 on the rotary disc 7 and the mounting of the optical reflection sensor 9 adjacent the rotary disc 7. In such a case the meter 1 is also provided with a connector for easy attachment of the conductors to the transformer 23 and a coupling between the optical reflection sensor 9 and the circuit card 10.

In order to comply with the requirement that the electricity meter should be protected against manipulation a baffle plate may be provided between the part of the casing where the inserting slot 17 is provided and the interior of the eletricity meter 1 comprising, among other parts, the rotary discs 4 and 7, the connection between the electricity meter 1 and the casing 2 with appertaining printing unit 20 only requiring a small number of conductors.

FIG. 3 illustrates an example of a power supply circuit for the electronic part of the electricity meter whereas FIG. 4 shows an example of a possible electronic circuit for the printing electricity meter. As an expert from the component designations indicated in FIGS. 3 and 4 will understand the constructive function of these circuits no more detailed description of the illustrated example of the circuits appears to be required.

When an existing electricity meter is to be modified for adaptation to the system according to the illustrated embodiment the following measures are to be taken. The casing of the electricity meter 1 is removed and replaced by a casing 2 according to the invention. The original counter is removed and the rotary disc 7 is provided with a non-reflective marking 8. The mounting plate 24 is attached to the meter by means of mounting screws 25 and the circuit card 10 is suitably attached to the mounting plate 24. The mounting plate 24 also comprises the coupling means 14. The current supply conductors to the transformer 23 are connected to the incoming conductors of the electricity meter. Thereafter casing 2 is put in place so that its contact means 15 engages coupling means 14, the sealing screws 3 are tightened and sealed and the device is ready for use.

In accordance with the invention there is thus obtained a device for sensing the rotation of rotary discs of an electricity meter, this sensing not exerting any force moment on the rotary units. In the preferred embodiment this has been obtained by optical reading of the rotation of rotary disc 7 and electrical transmission of the indication so obtained to the consumption meter. The device forms a manipulation-safe, sealable complement to already existing electricity meters but the invention may also be used in new products. By means of the invention there is obtained an automatic device for recording the actual measuring value at a certain moment as a visually and optically readable marking on a record card adapted to be used directly in a computer. Even if the punched-card principle might be applicable for this purpose the disadvatage with the punched-out wastage, so-called confetti, is serious in connection with electricity meters of the type here in question and would involve a need of removing the wastage at recurring intervals of time even if a baffle might be provided in order to prevent the wastage from disturbing the function of the electricity meter. Moreover, a punched-card marking often does not yield visually readable markings but only computer-readable combinations, which means that in such a case a separate, visual meter for the sake of the consumer would have to be provided. Despite the fact that in the above description the rotary disc 7 is said to be reflective, a non-reflective marking 8 yielding a signal indicating that the rotary disc and appertaining parts have performed a full turn, the expert on the field will understand that the rotary disc 7 (and of course also disc 4) may be non-reflective, the indicating signal being obtained by a reflective field on the disc moving past reflection sensor 9.

The recording device shown in FIGS. 5 to 7 for recording the measuring value of a water meter of the volume-meter type comprises four parts viz. the conventionally designed water meter casing 101 of the volume meter comprising the screw driven by the flowing water the rotation of which by means of a shaft is transmitted to a cog wheel 102, an intermediary ring 103, the recording unit 104 proper and a mounting ring 105 in the form of a screw-on flange. These parts replace the conventional water meter parts shown to the right and comprising the dial with counter wheels shown in the upper right-hand corner and market 106, the transparent cover 107 and the mounting flange 108.

When the device according to the present invention is to be applied to an existing conventional water meter this is disassembled for removal of the parts shown to the right in FIG. 5 whereafter the details shown to the left are mounted by placing the intermediary ring 103 onto the casing 101, placing the recording unit 104 onto the casing with the intermediary ring and thereafter screwing the mounting flange 105 onto the casing to hold the individual parts in position.

FIG. 6 shows the condition prior to the final mounting when the intermediary ring and the recording unit have been placed onto the water meter casing prior to attachment of the mounting ring or flange 105.

FIG. 7 shows the device in its assembled condition ready for use. The recording unit comprises, in addition to internal parts such as an identification marking for the specific meter, a counter unit comprising counter wheels and a printing unit, which parts may be designed in different ways and which do not form a part of the present invention, as well as an outer inserting opening or slot 109 through which the record card 110, for example in the form of a post-card, can be inserted as shown in FIG. 7. Thereafter, the identification marks and the actual measuring value are printed on the record card 110 by operation of the printing part of the recording unit 104 as released by an actuating knob 111 visible on top of the recording unit 104.

It is basically important in connection with the idea of the present invention that the printing meter used is driven by the medium to be measured irrespective of whether this is electricity or water as is the case in the devices according to the drawings, gas or other flowing medium. In FIGS. 5 to 7 there is shown an embodiment of a water meter, however, it is to be pointed out in this connection that with the aid of different adaptor rings the present invention may be used in connection with different basic constructions of available energy meters. In connection with water meters, however, it is particularly suitable to use a so-called volume meter, i.e. meters measuring the amount of flowing medium so that the water on its way through the meter passes through a space where a screw is driven by the flowing water, the reason being that if the consumer inadvertently or deliberately acts on the meter in some way or other so that the counter is stopped also the screw exposed to the water will be stopped causing not only the water meter but also the through-flow to be blocked if the counter is blocked. Prior attempts to use printing meters have been based on the use of supplied energy, such as electric energy, in e.g. water meters for recording purposes, this requirement being eliminated by the present invention. Obviously, it is suitable, after application of the instrument according to the invention on an existing water meter, to seal the mounting ring 105 to counteract improper manipulation and to secure an indication that no such manipulation has taken place.

Irrespective of the type of energy meter for measuring a number of consumption units of a flowing medium in accordance with the present invention, the basic principle is the following: For accounting purposes the accountant's department sends post-cards to the individual consumers for printing the actual measuring value in accordance with the present invention. As the present invention in addition to the measured value also prints an identification code on the post-card a guarantee is obtained that the measured value refers to the meter in question. When the accountant's department gets back the cards they are handled in a computer which automatically computes the charges enabling payment forms regarding the consumption cost to be distributed. The present invention offers a specific advantage in this connection in that in the meters preferably use is not made of indentification plates designed in successive series but that use is made of number wheels which are mutually adjustable in relation to each other for representation of a distinct subscriber's number. In connection with the installation the number wheels are blocked and the identified combination is fixed whereafter the device is sealed. This condition is particularly advantageous because the consumers already are provided with actual identifying codes which already are fed into the computer. Thus, due to the possibility of individual adjustment the previous identifying codes may be used and the individual meters may be adjusted in accordance therewith. In this connection it may be mentioned that normally a part of the code identifies the district in question and a part of the code the specific consumer in question.

For the purpose of application on the recording card of identifying marks and measured value the identifying figures and measure value figures may be disposed in the device either side-by-side so that the marking will be applied side-by-side on the recording card or the identifying code figures and counter figures may be provided in the arrangement in line below each other so that the markings will be applied to the recording card on places in line above and below each other. The choice is dependent on the shape of the recording card and, accordingly, the invention permits a certain flexibility in this respect.

It is possible, as stated above, that recording media in the form of post-cards are mailed by the accountant's department and sent to the consumers in question for printing and returning to the accountant's department for central computer-handling in which case for example by computer action the statement regarding subscriber or consumer is correlated and the dispatch of bills is performed. In this case the consumer only has one available card, and thus has no choice regarding the printing time which not necessarily has to coincide with the time of dispatch which means that the measuring value obtained definitely is the most recent one. On the other hand, this involves the disadvantage that due, for example, to faulty handling or damage in connection with mailing the consumer is not in possession of a new, intact card for printing and returning. Another imaginable accounting system comprises a recording medium in the form of a post-card accessible in places such as all post offices of the country where the consumer may get new post-cards for printing and returning. In such a case any faulty cards may be discarded and a new, intact card may be obtained, printed and returned. On the other hand, it is imaginable that some consumers in advance print measuring values on cards and at a later time return them whereby a faulty picture is obtained of the latest measuring value. However, such irregular use may be traced by personal visit in connection with spot checks. Possibly, the most secure system comprises sending for example four post-cards per year to the subscriber/consumer who thereafter quarterly prints and returns one card at a time. At the end of the year the received four cards have been used and in connection with the distribution of new cards and the returning of the first thereof any faults in connection with the debitation of the prior year may be corrected.

In spite of the fact that certain preferred embodiments of the invention have been described above the expert on the field will understand that these embodiments may be varied and modified within the basic idea of the invention as expressed in the attached claims.

What we claim is:

1. A device for periodic, automatic, readable recording of a meter value from a consumption measuring meter comprising: a casing attachable to an otherwise conventional meter and provided with a slot; a printing unit disposed within said casing and located out of the plane of said slot in order to be tamper-proof, said printing unit being composed of an identification data printer and a consumption value printer and being adapted upon insertion of a record card in the slot of the casing to apply to the record card a visually readable marking of the identification data and meter consumption value; and a push button connected to said printing unit and manually actuable for causing said marking to be applied to the record card by shifting said printing unit towards the record card inserted into the casing through said slot.

2. The device as claimed in claim 1 for measuring consumption of a medium other than electricity the meter being driven by and measuring the number of consumption units of a flowing medium which is caused to pass through a conventional metering unit wherein said casing is screwed onto the unit.

3. The device as claimed in claim 2 wherein the metering unit is a meter of volume-metering type and further comprising an adapting ring and a mounting ring mounting said casing on said adapting ring.

4. The device as claimed in claim 2 wherein said consumption value printer comprises a number of counter elements and said identification data printer comprises several individually adjustable and subsequently lockable number wheels for adapting the identification code of the individual meter to existing codes, and a record card inserted through the inserting slot can have applied thereto, in addition to the identification code, also a record of the actual positions of the individual counter elements.

5. The device as claimed in claim 1 wherein the identification data and consumption values are provided side-by-side for application to the record card at predetermined locations situated side-by-side.

6. The device as claimed in claim 1 wherein the identification data and consumption values are arranged in line with each other for application to the record card at locations provided in line above each other.

7. The device as claimed in claim 1 wherein said printing unit is adapted to apply to the record card a marking which is also optically readable.

8. The device as claimed in claim 1 for use with a record card in the form of a postcard.

9. The device as claimed in claim 3 wherein the metering unit is a water meter.

* * * * *